(12) United States Patent
Sawada

(10) Patent No.: US 7,723,683 B2
(45) Date of Patent: May 25, 2010

(54) ABERRATION CORRECTION SYSTEM

(75) Inventor: Hidetaka Sawada, Tokyo (JP)

(73) Assignee: Jeol Ltd., Tokyo (JP)

( * ) Notice: Subject to any disclaimer, the term of this patent is extended or adjusted under 35 U.S.C. 154(b) by 100 days.

(21) Appl. No.: 12/182,609

(22) Filed: Jul. 30, 2008

(65) Prior Publication Data

US 2009/0032709 A1 Feb. 5, 2009

(30) Foreign Application Priority Data

Aug. 2, 2007 (JP) ............................. 2007-202134
Apr. 17, 2008 (JP) ............................. 2008-107375

(51) Int. Cl.
*G01N 23/00* (2006.01)
*G21K 7/00* (2006.01)

(52) U.S. Cl. ....................... 250/311; 250/306; 250/307; 250/310; 250/398; 250/396 ML; 250/396 R

(58) Field of Classification Search ................ 250/306, 250/307, 310, 311, 398, 396 ML, 396 R
See application file for complete search history.

(56) References Cited

U.S. PATENT DOCUMENTS 5,221,884 A * 6/1993 Teshima ..................... 318/569
7,619,220 B2 * 11/2009 Sawada et al. ............... 250/311
2003/0029999 A1 2/2003 Hosokawa
2008/0093563 A1 * 4/2008 Sawada et al. ........... 250/396 R
2008/0128635 A1 * 6/2008 Sawada et al. ........... 250/396 R

FOREIGN PATENT DOCUMENTS

JP 2003-92078 3/2003

OTHER PUBLICATIONS

A.V.Crewe and D. Kopf, "A sextupole system for the correction of spherical aberration," Optik, vol. 55, No. 1, 1980, pp. 1-10.
H. Rose, "Outline of a spherically corrected semiaplanatic medium-voltage transmission electron microscope," Optik, vol. 85, No. 1, 1990, pp. 19-24.

* cited by examiner

*Primary Examiner*—Jack I Berman
*Assistant Examiner*—Meenakshi S Sahu
(74) *Attorney, Agent, or Firm*—The Webb Law Firm

(57) ABSTRACT

An aberration correction system for use in an electron microscope and which produces a negative spherical aberration and corrects a higher-order aberration. The aberration correction system has three stages of multipole elements which, respectively, produce fields of 3-fold symmetry with respect to the optical axis. Any two stages of multipole elements are disposed in directions not to cancel out the 3-fold fields. However, the three stages of multipole elements are so disposed as to cancel out 3-fold astigmatisms.

10 Claims, 5 Drawing Sheets

ABERRATION CORRECTION SYSTEM

BACKGROUND OF THE INVENTION

1. Field of the Invention

The present invention relates to an aberration correction system for use in a transmission electron microscope and, more particularly, to an aberration correction system using three stages of multipole elements each producing a field of 3-fold symmetry.

2. Description of Related Art

One of the factors that limit the spatial resolution of an electron microscope is a variety of aberrations in the optical system. Especially, spherical aberration, which is one of such aberration, limits the spatial resolution because an axisymmetric lens always has a positive spherical aberration coefficient. This creates an intrinsic problem.

This problem has been dealt with in A. V. Crewe and D. Kopf, *Optik*, Vol. 55 (1980), pp. 1-10, where a result of a theoretical analysis has been shown. That is, a single stage hexapole element having a thickness along the optical axis has a negative spherical aberration coefficient. This suggests that spherical aberration can be reduced by introducing a hexapole element into the optical system. Subsequently, it has been pointed out that if only the single stage hexapole element is used, a second-order aberration occurs. Accordingly, incorporating a single stage hexapole element in a transmission electron microscope results in low usefulness. However, the fact that a hexapole element produces a negative spherical aberration coefficient is very useful to correction of spherical aberration. Techniques for reducing spherical aberration using hexapole elements have been improved further.

An example in which an aberration correction system equipped with a hexapole element having a negative spherical aberration and a thickness along the optical axis is applied to a transmission electron microscope is proposed in H. Rose, *Optik*, Vol. 85 (1990), pp. 19-24. This aberration correction system has a first transfer lens, a first hexapole element, a second transfer lens, and a second hexapole element arranged in turn. In this system, each transfer lens has two axisymmetric lenses.

An aberration correction system having two stages of multipole elements each having a thickness along the optical axis is shown in JP-A-2003-92078. This system has two stages of multipole elements (e.g., hexapole elements) and a transfer lens interposed between them. Each multipole element produces a field of 3-fold symmetry, generating a 3-fold astigmatism and a negative spherical aberration.

In the system of the above-cited JP-A-2003-92078, the rear stage of multipole element operates to cancel out the 3-fold astigmatism produced by the front stage multipole element and, therefore, the whole optical system produces a negative spherical aberration. Consequently, where an axisymmetric lens (e.g., an objective lens) producing a positive spherical aberration is disposed ahead of or behind the system, the spherical aberration in the whole optical system is reduced.

However, the above-described aberration-correcting techniques correct aberrations only up to the fourth order and cannot achieve complete correction of higher-order aberrations. For example, fifth-order spherical aberration can be corrected by optically controlling the distance between the objective lens and the aberration corrector but astigmatism of the same order (i.e., 6-fold astigmatism) cannot be corrected. Because this is a factor limiting aberration correction, it cannot be expected that the spatial resolution will be improved further.

An actual multipole element has a finite thickness along the optical axis. Where this multipole element produces a magnetic or electric field with 3-fold symmetry, if the spherical aberration is corrected by the multipole element, higher-order aberrations dependent on the thickness are induced. Furthermore, the combination of the two stages produces higher-order aberrations. Consequently, the range of incident angles of the electron beam that can be aberration-corrected is limited. This limitation makes it difficult to reduce diffraction aberration.

This limitation to the angles is further described by referring to the Ronchigram of FIG. 7. This diagram is obtained when an electron beam passing through two stages of multipole elements is corrected for aberrations, each of the multipole elements producing a magnetic field of 3-fold symmetry with respect to the optical axis. A low-contrast region appearing in the center of the diagram corresponds to the angle of incidence of the electron beam on each multipole element, the beam having been appropriately corrected for aberrations. Where a maximum value of the angle of incidence is roughly described, a maximum circle centered at the central point of the region and including only the region is fitted. The angle of incidence of the electron beam is computed from the radius of the circle. It can be seen from the diagram of FIG. 7 that the maximum incident angle of the electron beam that has been appropriately corrected for aberrations is about 50 mrad.

However, where regions located around the circle are noticed, one can observe that a region where an amorphous image is seen is hexagonal, because the fifth-order aberration, or the sixth-order astigmatism, is left as a residual aberration. In the case of the multipole elements producing the diagram of FIG. 7, the angle of incidence of the electron beam that can be corrected for aberrations is 50 mrad at maximum. It is difficult to appropriately correct the electron beam having a greater angle of incidence for aberrations. Accordingly, if one tries to reduce diffraction aberration, the spatial resolution is limited due to the limitation on the angle of incidence.

Higher-order aberrations (6-fold astigmatisms) produced from multipole elements that generate fields of 3-fold symmetry is induced because the magnetic or electric fields are distributed in directions to cancel out their mutual astigmatisms of 3-fold symmetry. That is, if multipole elements are rotated relative to each other such that each multipole element is rotated through 60° or 180° relative to the magnetic or electric field as in the prior art, higher-order aberrations are produced.

SUMMARY OF THE INVENTION

Accordingly, it is an object of the present invention to provide an aberration correction system which is for use in an electron microscope and which corrects the above-described higher-order aberrations while holding a negative spherical aberration.

This object is achieved by an aberration correction system having three stages of multipole elements arranged in a row along an optical axis, each of the multipole elements having a thickness along the optical axis. The three stages of multipole elements include a front stage of multipole element, a middle stage of multipole element, and a rear stage of multipole element. The front stage of multipole element produces a first magnetic or electric field that shows a 3-fold symmetry with respect to the optical axis. The middle stage of multipole element produces a second magnetic or electric field that shows a 3-fold symmetry with respect to the optical axis. The rear stage of multipole element produces a third magnetic or electric field that shows a 3-fold symmetry with respect to the optical axis. Within the second magnetic or electric field, a distribution of a magnetic or electric field of 3-fold symmetry is produced in a direction not to cancel out an astigmatism of 3-fold symmetry produced from the first magnetic or electric field or from the third magnetic or electric field. Within the third magnetic or electric field, a distribution of a magnetic or electric field of 3-fold symmetry is produced in a direction not to cancel out an astigmatism of 3-fold symmetry produced from the first magnetic or electric field or from the third magnetic or electric field. An aberration of 3-fold symmetry produced by the front stage of multipole element is rotated using the middle stage of multipole element. An aberration of 3-fold symmetry produced by the middle stage of multipole element is rotated using the rear stage of multipole element. The fields produced by the three stages of multipole elements are combined to cancel out their mutual astigmatisms of 3-fold symmetry. The aforementioned rotation is an electron optical angular rotation made when a field produced by one multipole element is transferred to the next multipole element. Rotating action of each lens is taken into consideration. That is, a magnetic lens produces a rotating action about the optical axis, as well as a transferring action and a magnification-varying action. The rotating action is affected by the accelerating voltage and by the strength of the magnetic field. With respect to the distributions of the fields produced by the multipole elements located, respectively, ahead of and behind the magnetic lens, the rotational positional relationship between the 3-fold astigmatisms of two multipole elements must be discussed taking account of rotation induced by the lens. In the present specification, rotational positional relationships are set forth on the assumption that an angle given by this rotation is zero. That the electron optical rotational relation is taken into consideration means that this rotation is taken into consideration.

In another feature of the present invention, the angular relational relationship between the magnetic or electric fields produced by the multipole elements is set as follows. Any one of the second and third magnetic or electric field is rotated through an angle of 40° relative to the first magnetic or electric field, taking account of the rotating action of an electron optical lens within a plane perpendicular to the optical axis. The other is rotated through 80° relative to the first magnetic or electric field, taking account of the rotating action of the electron optical lens within the plane perpendicular to the optical axis. The second magnetic or electric field and the third magnetic or electric field are so distributed that they are rotated in the same direction. A field of 3-fold symmetry has a rotational symmetry of 120°. Where a mirror-symmetric system is taken into consideration, rotational positional relationships given by 40° and 80° are equivalent to 120°×m±40° and 120°×m±80°, respectively.

In another feature of the present invention, the angular relational relationship between the magnetic or electric fields produced by the multipole elements is set as follows. The second magnetic or electric field is so distributed that it is rotated through 120°×m±about 72° (where m is an integer) relative to the first magnetic or electric field, taking account of the rotating action of an electron optical lens within a plane perpendicular to the optical axis. The third magnetic or electric field is so distributed that it is rotated through 120°× m±about 24° relative to the first magnetic or electric field, taking account of the rotating action of the electron optical lens within the plane perpendicular to the optical axis.

According to the above-described configuration, 3-fold astigmatism and 6-fold astigmatism can be removed while producing a negative spherical aberration and, therefore, the spatial resolution is improved. Furthermore, the range of incident angles in which aberration correction can be made can be widened. This reduces diffraction aberration and further improves the spatial resolution.

Other objects and features of the invention will appear in the course of the description thereof, which follows.

DESCRIPTION OF THE PREFERRED EMBODIMENTS

Figure 1:
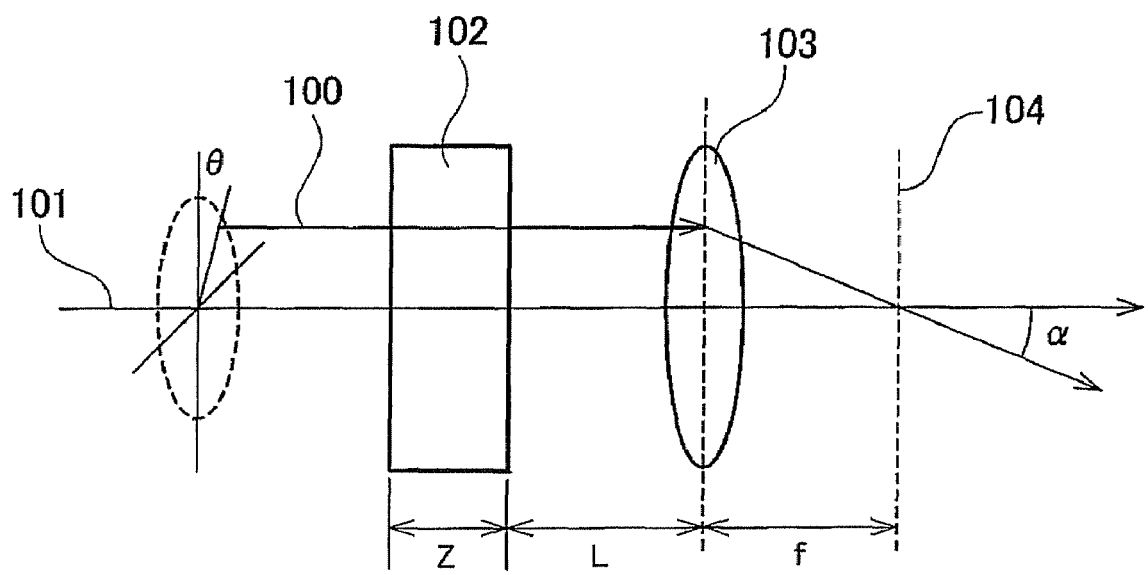
FIG. 1 is a ray diagram illustrating aberrations produced by a single stage multipole element having a thickness along an optical axis.

First, aberrations produced when an electron beam passes through both a single stage multipole element and an objective lens are described, the multipole element having a thickness along the optical axis. FIG. 1 is a schematic ray diagram of aberrations produced on a surface of a specimen when the electron beam has passed through the single stage of multipole element.

The single stage of multipole element 102 (e.g., a hexapole element) and the objective lens 103 are arranged in a row along the optical axis 101. It is assumed that the multipole element 102 produces a magnetic or electric field that shows 3-fold symmetry with respect to the optical axis 101. After passing through the multipole element 102, the beam 100 is focused onto the surface 104 of the specimen by the objective lens 103. The complex angle $\Omega_0$ of the electron beam incident on the multipole element 102 is defined by $$\Omega_0 = \alpha \exp(i\phi) \tag{1}$$

The complex angle $\Omega_0$ is represented by two variables $\alpha$ and $\phi$. The variable $\alpha$ is the angle at which the beam impinges on the specimen. The variable $\phi$ is a phase angle (azimuth). Without using $\alpha$ and $\phi$ which are employed in a cylindrical coordinate system, the complex angle can be written as follows using coordinate coordinates (u, v):

$$\Omega = \omega_u + i\omega_v$$

Note, however, that if the spatial frequencies of a reciprocal space are given by (u, v), it follows that $(\omega_u, \omega_v) = \lambda(u, v)$. This complex conjugate is given by $$\overline{\Omega}_0 = \alpha \exp(-i\phi) \quad (2)$$

Then, let z be the thickness (length) of the multipole element 102 along the optical axis 101. Let f be the focal distance of the objective lens. It is assumed that the optical distance L between the multipole element 102 and the objective lens 103 is 0. The optical distance L can be adjusted, for example, by inserting a transfer lens between the multipole element 102 and the objective lens 103.

Let r be the position of the electron beam 100 on the specimen surface 104. Let r' be the tilt (angle to the optical axis) of the beam. Under the above conditions, the position r and the tilt r' are given by $$r = -\frac{1}{2f}A_3\overline{\Omega}_0^2 z^2 + \frac{|A_3|^2}{12f^3}\Omega_0\overline{\Omega}_0^2 z^4 - \frac{\overline{A}_3|A_3|^2}{120f^5}\Omega_0^4 z^6 - \frac{A_3|A_3|^2}{180f^5}\Omega_0\overline{\Omega}_0^3 z^6 + \frac{A_3^2|A_3|^2}{3360f^5}\overline{\Omega}_0^5 z^8 \quad (3)$$

$$r' = -\frac{1}{f}A_3\overline{\Omega}_0^2 z + \frac{|A_3|^2}{3f^3}\overline{\Omega}_0\Omega_0^2 z^3 - \frac{\overline{A}_3|A_3|^2}{20f^5}\Omega_0^4 z^5 - \frac{A_3|A_3|^2}{30f^5}\Omega_0\overline{\Omega}_0^3 z^5 + \frac{A_3^2|A_3|^2}{420f^5}\overline{\Omega}_0^5 z^7 \quad (4)$$

where $A_3$ is the 3-fold astigmatism coefficient (per unit length). Let $a_3$ be the strength of the 3-fold astigmatism. Let $\theta$ be the azimuthal angle of the 3-fold astigmatism. The 3-fold astigmatism coefficient is given by $$A_3 = a_3 \exp i(3\theta) \quad (5)$$

$$\overline{A}_3 \quad (6)$$

Eq. (6) gives the complex conjugate of $A_3$.

Each term of the right sides of Eqs. (3) and (4) represents an aberration. In particular, the first term of the right side of each equation indicates the second-order, 3-fold astigmatism. The second term indicates the third-order negative spherical aberration. The third and fourth terms indicate the fourth-order, three-lobe aberrations. The fifth term indicates the fifth-order, 6-fold astigmatism.

Aberrations appearing when a single stage of multipole element is used have been described so far.

Where two stages of multipole elements are prepared and 3-fold astigmatism produced from the first stage of multipole element is canceled, the position of the electron beam assumed after leaving the second stage of multipole element is given by $$r' = -\frac{2|\tilde{A}_3|^2}{3f^3}\overline{\Omega}_0\Omega_0^2 z^3 + \frac{\tilde{A}_3^2|\tilde{A}_3|^2}{14f^7}\overline{\Omega}_0^5 z^7 + \ldots \quad (7)$$

The first term of Eq. (7) is a negative spherical aberration intentionally produced to cancel out the spherical aberration in the objective lens. The second term produces a higher-order aberration (6-fold astigmatism) because the two stages of multipole elements are prepared and that the 3-fold astigmatism produced from the first stage of multipole element is canceled out.

Accordingly, in the present invention, three stages of multipole elements are prepared. The multipole elements are so operated that a combination of any two stages does not cancel out a 3-fold astigmatism. Rather, the three stages of multipole elements cancel out 3-fold astigmatisms. In this way, an optical system that cancels out the higher-order aberration is built.

Figure 2A:
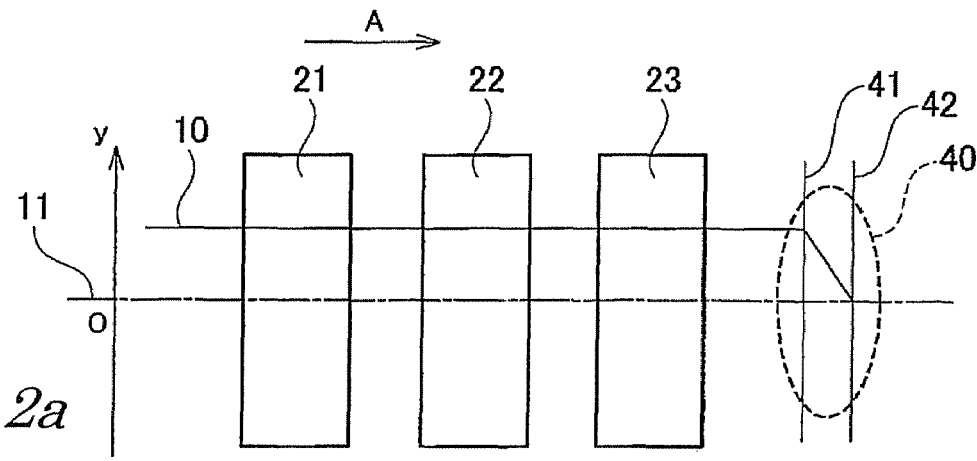
FIG. 2a is a schematic diagram of an aberration correction system associated with an embodiment of the present invention.

One embodiment of the aberration correction system associated with the present invention is described. FIG. 2a is a schematic diagram of an aberration correction system associated with an embodiment of the present invention.

As shown in FIG. 2a, the aberration correction system associated with the present embodiment is equipped with three stages of multipole elements producing fields of 3-fold symmetry with respect to the optical axis 11. In this diagram, an electron beam 10 passes from a front stage of multipole element 21 to a rear stage of multipole element 23. Then, the beam 10 passes through the coma-free plane 41 of an objective lens 40 that substantially corresponds to the front focal plane of the objective lens 40. Subsequently, the beam is focused onto a specimen surface 42. One example of each multipole element is a hexapole element. Another example is a dodecapole (12-pole) element. Each multipole element may have any number of poles as long as the element produces a field of 3-fold symmetry with respect to the optical axis 11.

In the aberration correction system associated with the present embodiment, the field of 3-fold symmetry (second field of 3-fold symmetry) produced by the middle stage of multipole element 22 is so distributed that it has been rotated through 40° relative to the field of 3-fold symmetry (first field of 3-fold symmetry) produced by the front stage of multipole element 21 within the plane perpendicular to the optical axis 11. Furthermore, the field of 3-fold symmetry (third field of 3-fold symmetry) produced by the rear stage of multipole element 23 is so distributed that it has been rotated through 80° relative to the field of 3-fold symmetry produced by the front stage of multipole element 21 within the plane perpendicular to the optical axis 11. The fields of 3-fold symmetry produced by the middle stage of multipole element 22 and the rear stage of multipole element 23, respectively, are so distributed that they have been rotated in the same direction relative to the field of 3-fold symmetry produced by the front stage of multipole element 21.

Also, in the case where the three fields of 3-fold symmetry are distributed as described above, the characteristics of aberrations produced by one field of 3-fold symmetry are fundamentally given by Eqs. (3) and (4). Therefore, aberrations produced by the three fields of 3-fold symmetry in the present embodiment are found by a combination of these equations taking account of the rotational positional relationships among the fields of 3-fold symmetry.

Accordingly, it is assumed that the fields produced by the front stage of multipole element 21, middle stage of multipole element 22, and rear stage of multipole element 23 result in 3-fold astigmatism coefficients $A_{3A}$, $A_{3B}$, and $A_{3C}$, respectively. We now take note of only these coefficients. The 3-fold astigmatism coefficients produced by the fields of 3-fold symmetry are given by $$A_{3A} = a_3 \exp i(3\theta)$$

$$A_{3B} = a_3 \exp i(3(\theta+40°)) = a_3 \exp i(3\theta+120°)$$

$$A_{3C} = a_3 \exp i(3(\theta+80°)) = a_3 \exp i(3\theta+240°) \quad (8)$$

Therefore, the sum of them is given by $$|A_{3A}+A_{3B}+A_{3C}|=0 \quad (9)$$

It can be seen that the 3-fold astigmatisms are canceled out.

On the other hand, a negative spherical aberration coefficient does not depend on the rotational positional relationships among the fields of 3-fold symmetry. Therefore, the negative spherical aberration coefficient has a magnitude that is three times as high as the intensity of the coefficient produced by one field of 3-fold symmetry. Consequently, the negative spherical aberration coefficient can be used for correction of the spherical aberration in the objective lens.

The 6-fold astigmatism appearing from within one multipole element is now discussed using Eq. (4). Similarly to Eq. (8), the 6-fold astigmatism coefficients possessed by the multipole elements, respectively, are given by $$A_{3A}{}^2 = a_3{}^2 \exp i(6\theta)$$

$$A_{3B}{}^2 = a_3{}^2 \exp i(6(\theta+40°)) = a_3{}^2 \exp i(6\theta+240°)$$

$$A_{3C}{}^2 = a_3{}^2 \exp i(6(\theta+80°)) = a_3{}^2 \exp i(6\theta+480°) = a_3{}^2 \exp i(6\theta+120°) \quad (10)$$

As a result, we obtain $$|A_{3A}{}^2 + A_{3B}{}^2 + A_{3C}{}^2| = 0 \quad (11)$$

That is, if the fields of 3-fold symmetry produced by the middle stage of multipole element 22 and rear stage of multipole element 23, respectively, are so distributed that they have been rotated through 40° and 80°, respectively, in the same direction within the plane perpendicular to the optical axis 11 relative to the field of 3-fold symmetry produced by the front stage of multipole element, then the 6-fold astigmatism derived from Eq. (4) is canceled out. Consequently, the three stages of multipole elements 21, 22, 23 producing the above-described fields of 3-fold symmetry cancel out the 3-fold and 6-fold astigmatisms while producing a negative spherical aberration.

In the above-described configuration, it can be seen that it does not matter which one of the fields of 3-fold symmetry rotated through 40° and 80°, respectively, relative to the field of 3-fold symmetry produced by the front stage of multipole element 21 is located ahead of the other. That is, the middle stage of multipole element 22 may produce a field of 3-fold symmetry rotated through 80° relative to the field of 3-fold symmetry produced by the front stage of multipole element 21, and the rear stage of multipole element 23 may produce a field of 3-fold symmetry rotated through 40° relative to the field of 3-fold symmetry produced by the front stage of multipole element 21. Also, in this case, the 3-fold astigmatism and 6-fold astigmatism are canceled out while a negative spherical aberration is produced.

Figures 2B, 2C, 2D:
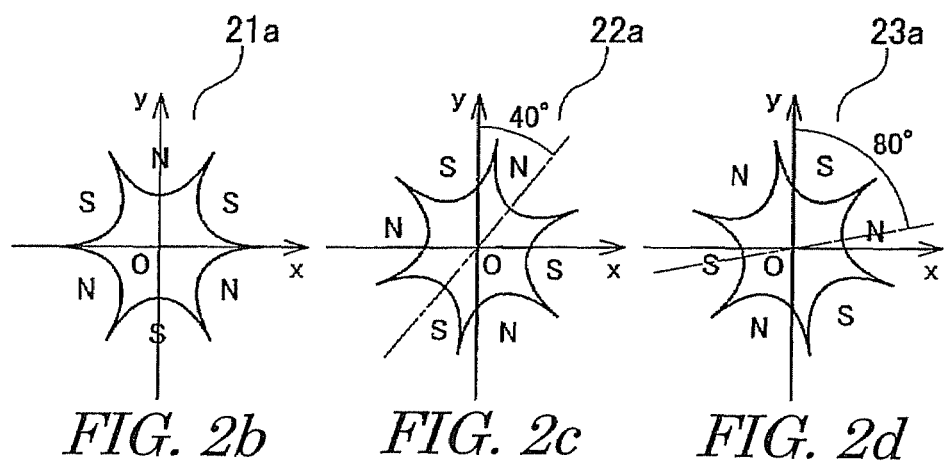
FIGS. 2b-2g are schematic diagrams showing arrangements of multipole elements.

The multipole elements producing the above-described three fields of 3-fold symmetry are arranged as follows. Any one of the middle stage of multipole element 22 and the rear stage of multipole element 23 is rotated through 40° relative to the front stage of multipole element 21 within the plane perpendicular to the optical axis 11. The other is rotated through 80° within the plane perpendicular to the optical axis 11. At this time, the middle stage of multipole element 22 and the rear stage of multipole element 23 are disposed to be rotated in the same direction. FIGS. 2b-2d show one example of the arrangement of the multipole elements based on the above-described arrangement. In these figures, the arrangement of the front stage of multipole element 21 as viewed along the direction indicated by the arrow A from the origin O on the optical axis 11 shown in FIG. 2a is indicated by 21a. The arrangement of the middle stage of multipole element 22 is indicated by 22a. The arrangement of the rear stage of multipole element 23 is indicated by 23a. This rotational positional relationship needs to be noticed after a rotation is made by the transfer lens. If an electron optical rotation of 40° is achieved by the transfer lens, it does not matter whether the rotation of 40° is made physically. A field of 3-fold symmetry has a rotational symmetry of 120°. Where a mirror-symmetric system is considered, the rotational positional relationships given by 40° and 80°, respectively, are equivalent to 120°× m±40° and 120°×m±80°, respectively.

In the discussion made thus far using Eq. (4), a 6-fold astigmatism produced within a single multipole element has been noticed.

Then, using Eq. (7), a system is discussed in which a 6-fold astigmatism produced by interferences between 3-fold astigmatisms produced by two or more multipole elements is taken into consideration.

Three stages of multipole elements are prepared, and 3-fold astigmatisms are canceled out by the three stages. Let $A_{3A}$, $A_{3B}$, and $A_{3C}$ be 3-fold astigmatism coefficients produced by the front, middle, and rear stages of multipole elements, respectively. The tilt of the electron beam leaving the third stage of multipole element with respect to the 6-fold astigmatism is given by $$\frac{\overline{A_{3A}}A_{3A}^3\overline{\Omega}^5}{420f^7} + \frac{\overline{A_{3A}}A_{3A}^2A_{3B}\overline{\Omega}^5}{30f^7} + \frac{\overline{A_{3B}}A_{3A}^2A_{3B}\overline{\Omega}^5}{30f^7} + \\ \frac{\overline{A_{3B}}A_{3B}^3\overline{\Omega}^5}{420f^7} - \frac{\overline{A_{3A}}A_{3A}^2A_{3C}\overline{\Omega}^5}{30f^7} + \frac{\overline{A_{3B}}A_{3A}^2A_{3C}\overline{\Omega}^5}{30f^7} - \\ \frac{\overline{A_{3B}}A_{3A}A_{3B}A_{3C}\overline{\Omega}^5}{15f^7} - \frac{\overline{A_{3C}}A_{3A}A_{3B}A_{3C}\overline{\Omega}^5}{15f^7} + \\ \frac{\overline{A_{3B}}A_{3B}^2A_{3C}\overline{\Omega}^5}{30f^7} + \frac{\overline{A_{3C}}A_{3B}^2A_{3C}\overline{\Omega}^5}{30f^7} + \frac{\overline{A_{3C}}A_{3C}^3\overline{\Omega}^5}{420f^7} \quad (12)$$

Figure 7:
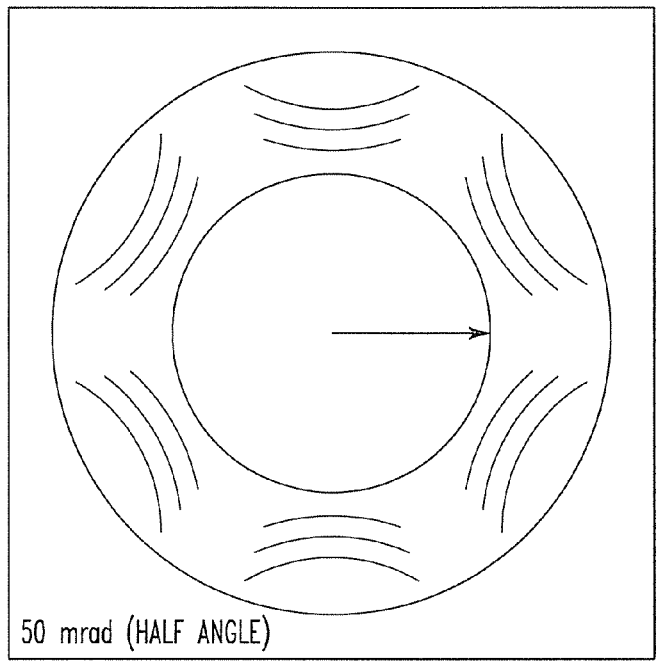
FIG. 7 is a representation of a Ronchigram obtained according to the prior art by passing an electron beam through two stages of multipole elements each having a thickness along an optical axis.

As given by Eq. (12), if the three stages of fields of 3-fold symmetry are used, it is possible to make a setting in such a way as to cancel out a higher-order aberration (6-fold astigmatism) of the second term, because the magnitude of the higher-order aberration (6-fold astigmatism) of the second term is made of the coefficient of each 3-fold astigmatism. The three-lobe aberrations (fifth-order aberrations) of the aberrations of 3-fold symmetry can be corrected even by the prior art two-stage design as shown in FIG. 7. These aberrations can also be corrected by the three-stage design of the present invention.

Figure 8:
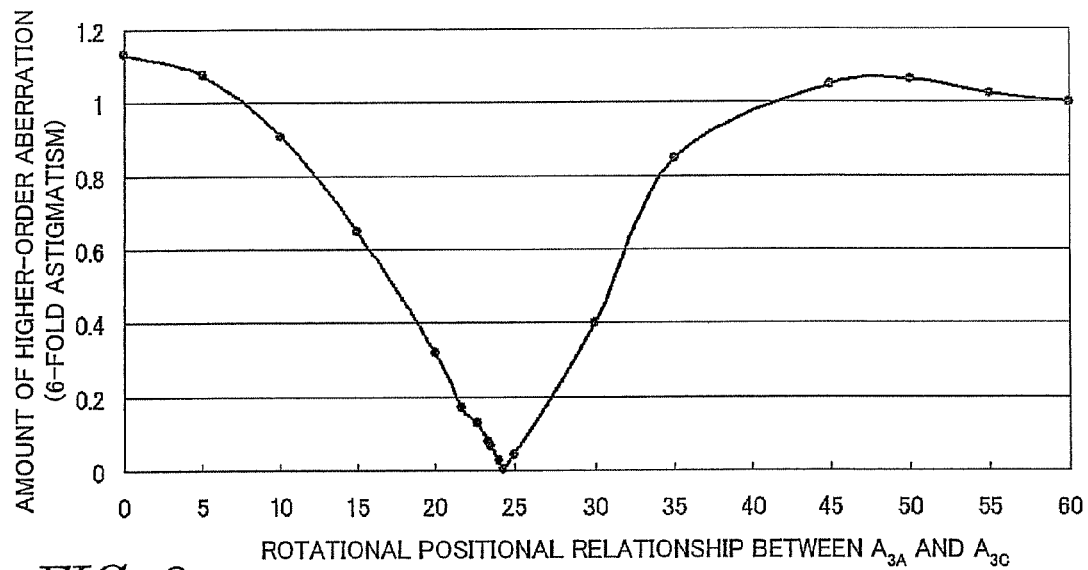
FIG. 8 is a graph showing the relationship of the amount of 6-fold astigmatism to the angle made between fields of 3-fold symmetry respectively produced by a front stage of multipole element and a rear stage of multipole element.

FIG. 8 is a graph in which the amount of a higher-order aberration (6-fold astigmatism) produced when two stages of multipole elements are used is plotted on the vertical axis and the angle made between the multipole elements producing the 3-fold astigmatism coefficients $A_{3A}$ and $A_{3C}$ is plotted on the horizontal axis. The amount of the higher-order aberration has been normalized to 1 using Eq. (11) to indicate the relative amount of the 6-fold astigmatism. The system is so set that the 3-fold astigmatisms are canceled out by combining the fields of 3-fold symmetry produced by the three stages of multipole elements.

It can be seen that if the rotational positional relationship between the multipole elements producing the 3-fold astigmatism coefficients $A_{3A}$ and $A_{3C}$, respectively, is varied, the amount of the 6-fold astigmatism decreases and assumes a minimum value around 24°. In a region of less than ±6° about 24° (i.e., the angle made between the multipole elements producing the 3-fold astigmatism coefficients $A_{3A}$ and $A_{3C}$ is 72°±6°), the amount of the 6-fold astigmatism is less than half of the amount produced when two stages of multipole elements are combined. This demonstrates that the astigmatisms have been corrected effectively.

Thus, in the aberration correction system associated with another embodiment of the present invention, the field of 3-fold symmetry (second field of 3-fold symmetry) produced by the middle stage of multipole element 22 is distributed to have been rotated through about 72° relative to the field of 3-fold symmetry (first field of 3-fold symmetry) produced by the front stage of multipole element 21 within the plane perpendicular to the optical axis 11. Furthermore, the field of 3-fold symmetry (third field of 3-fold symmetry) produced by the rear stage of multipole element 23 is distributed to have been rotated through about 24° relative to the field of 3-fold symmetry produced by the front stage of multipole element 21 within the plane perpendicular to the optical axis 11.

A 3-fold field returns to its original state if rotated through 120°. Furthermore, a 3-fold field can be realized by a mirror-symmetric optical system. The rotational positional relationship described so far can be generalized as follows from geometrical symmetry. The angle made between the first stage of multipole element and the second stage of multipole element can be generalized to 120°×m±about 72° (where m is an integer) within the plane perpendicular to the optical axis 11. The angle made between the second stage of multipole element and the third stage of multipole element can be generalized to 120°×m±24° within the plane perpendicular to the optical axis 11.

Meanwhile, a negative spherical aberration coefficient does not depend on the rotational positional relationship between the fields of 3-fold symmetry and thus the combination of the intensities created by the three fields of 3-fold symmetry can be used for correction of the spherical aberration in an objective lens.

Figures 2E, 2F, 2G:
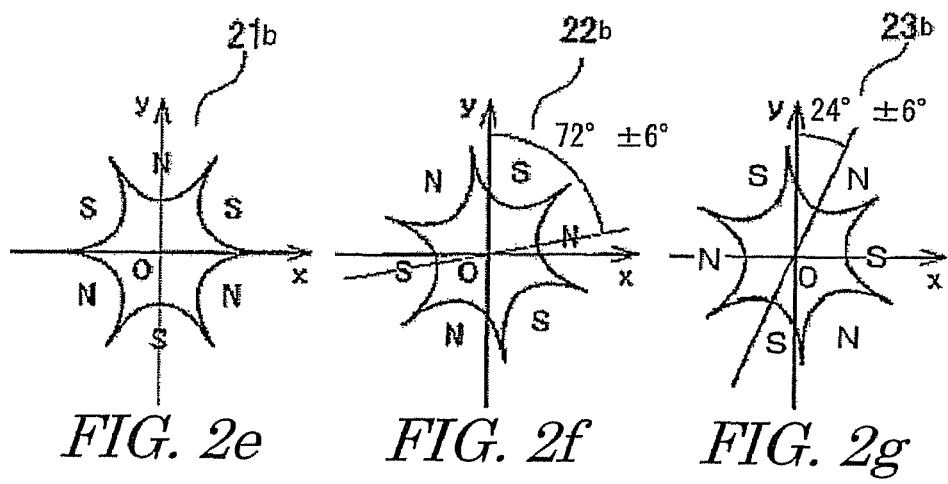
Figure 3:
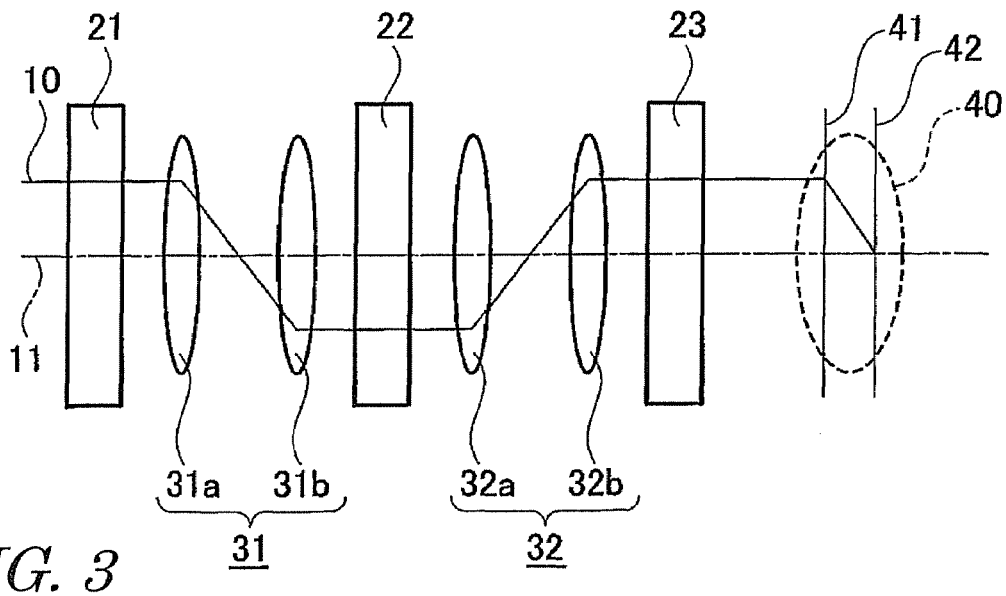
FIG. 3 is a schematic ray diagram of an aberration correction system associated with one embodiment of the present invention, and in which first and second transfer lenses are mounted.
Figure 4:
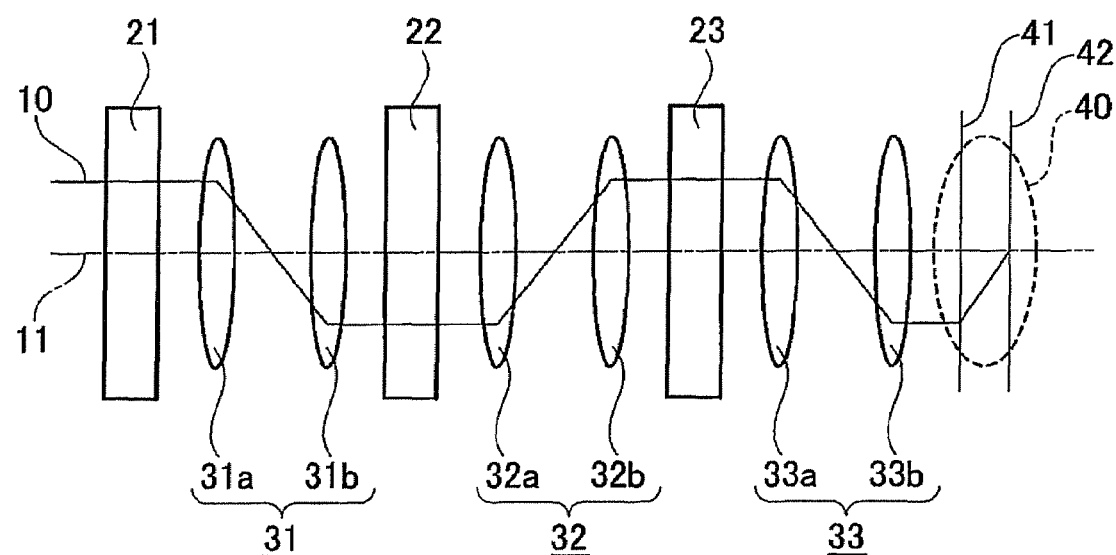
FIG. 4 is a schematic ray diagram of an aberration correction system associated with one embodiment of the present invention, and in which first, second, and third transfer lenses are mounted.

FIGS. 2e-2f show one example of the arrangement of the multipole elements based on the above-described arrangements. In these figures, the arrangement of the front stage of multipole element 21 as viewed along the direction indicated by the arrow A from the origin O on the optical axis 11 shown in FIG. 2a is indicated by 21b. The arrangement of the middle stage of multipole element 22 is indicated by 22b. The arrangement of the rear stage of multipole element 23 is indicated by 23b. These rotational positional relationships need to be noticed after a rotation is made by the transfer lens. If electron optical rotations of 120°×m±72° and 120°×m±24°, respectively, are achieved by transfer lenses, it does not matter whether these rotations are made physically.

Accordingly, the three stages of multipole elements 21, 22, and 23 producing the fields of 3-fold symmetry as described above cancel out the 3-fold astigmatisms while producing a negative spherical aberration. Furthermore, 6-fold astigmatism that is a higher-order aberration is also corrected.

In order to produce three fields of 3-fold symmetry as described above, rotating means (not shown) for rotating the multipole elements 21, 22, and 23 within the plane perpendicular to the optical axis 11 may be mounted.

Furthermore, in the aberration correction system associated with the present embodiment, a pair of first transfer lenses 31 may be mounted between the front stage of multipole element 21 and the middle stage of multipole element 22, and a pair of second transfer lenses 32 may be mounted between the middle stage of multipole element 22 and the rear stage of multipole element 23.

The first transfer lenses 31 of the pair have two axisymmetric lenses 31a and 31b and transfer an image equivalent to the image obtained by the front stage of multipole element 21 to the middle stage of multipole element 22. Furthermore, the second transfer lenses 32 of the pair have two axisymmetric lenses 32a and 32b and transfer an image equivalent to the image obtained by the middle stage of multipole element 22 to the rear stage of multipole element 23. That is, the optical distance between the multipole elements is reduced down to zero by the pairs of transfer lenses 31 and 32.

In this case, the pairs of transfer lenses 31 and 32 only act to transfer the equivalent images to between the multipole elements and so do not affect the optical characteristics relying on the three fields of 3-fold symmetry. In addition, a distance can be secured between the multipole elements. This provides wider latitude in disposing the multipole elements.

Additionally, a pair of third transfer lenses 33 may be mounted between the objective lens 40 and the rear stage of multipole element 23, in addition to the first and second transfer lenses 31, 32.

The third transfer lenses of the pair have two axisymmetric lenses 33a and 33b and transfer an image equivalent to the image obtained by the rear stage of multipole element 23 to the objective lens 40. That is, the optical distance between them is zero. The third transfer lenses of the pair only act to transfer the equivalent image to the objective lens 40 in the same way as the first and second transfer lenses 31, 32. Therefore, the third lenses do not affect the optical characteristics relying on the three fields of 3-fold symmetry. This offers wider latitude in disposing the rear stage of multipole element 23 and the objective lens 40.

Figure 5:
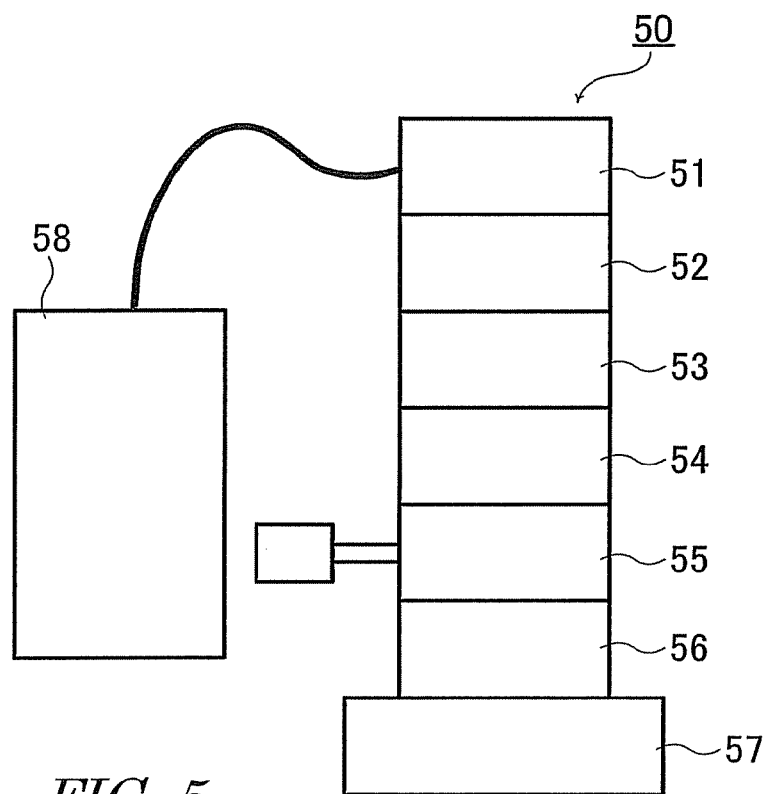
FIG. 5 is a block diagram of a transmission electron microscope having an illumination system aberration corrector made of an aberration correction system associated with one embodiment of the present invention.
Figure 6:
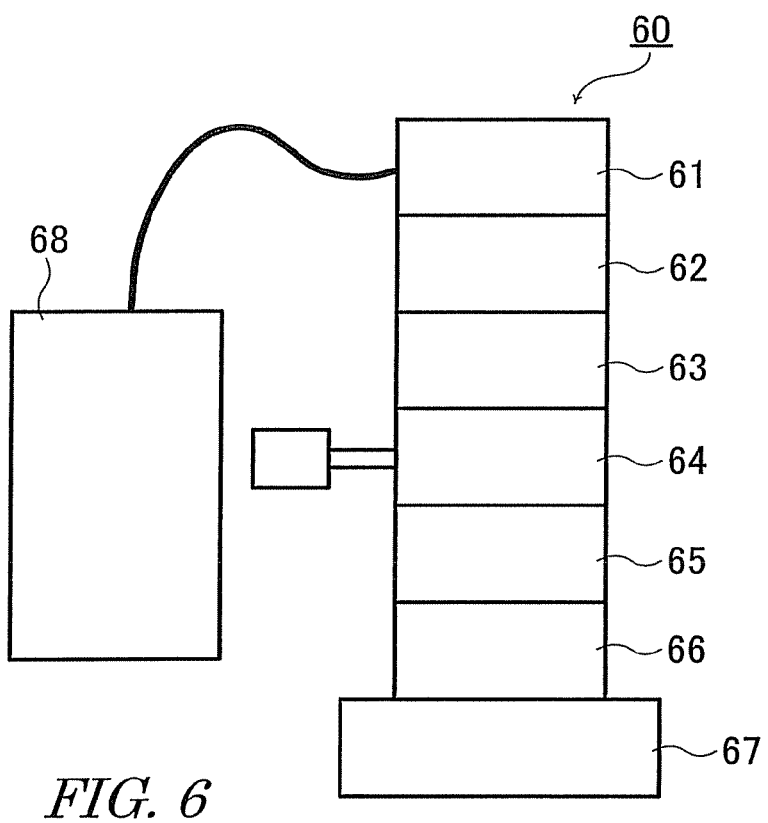
FIG. 6 is a block diagram of a transmission electron microscope having an imaging system aberration corrector made of an aberration correction system associated with one embodiment of the present invention.

An example in which an aberration correction system associated with one embodiment of the present invention is incorporated in a transmission electron microscope is described by referring to FIGS. 5 and 6.

FIG. 5 shows an example of transmission electron microscope 50 using the aberration correction system as an illumination system aberration corrector.

An electron gun 51 produces an electron beam (not shown) under control of a high-voltage control portion 58 and accelerates the beam to a desired energy. A first condenser lens 52 then focuses the accelerated beam. The focused beam passes through an illumination system aberration corrector 53. At this time, the aforementioned aberration correction is performed. The beam leaving the aberration corrector 53 is focused by a second condenser lens 54 and passes through an objective lens and a specimen stage 55. A specimen is placed on the stage 55.

The electron beam transmitted through the specimen is enlarged by an intermediate projector lens 56. Then, the beam impinges on a fluorescent screen (not shown) in an observation chamber 57. The image of the specimen projected onto the fluorescent screen is captured by a camera.

When the beam passes through the objective lens and specimen stage 55, the objective lens further focuses the beam. A positive spherical aberration due to the objective lens acts to increase the spot diameter of the beam on the specimen surface. However, the positive spherical aberration is canceled out by a negative spherical aberration produced by the illumination system aberration corrector 53. Consequently, a very small spot of the beam is obtained on the specimen surface.

On the specimen surface, 3-fold astigmatisms, 6-fold astigmatism, and other astigmatisms are removed. Therefore, the range of incident angles of the electron beam capable of being corrected for aberrations is widened in the illumination system.

When the range of the incident angles of the electron beam is enlarged, diffraction aberration decreases. This further improves the spatial resolution of the transmission electron microscope.

Since the quite small spot is obtained on the specimen surface, analysis of characteristic X-rays can be performed at high spatial resolution when the optical system of the transmission electron microscope 50 has a deflector (not shown).

FIG. 6 shows an example of a transmission electron microscope, indicated by 60, using an aberration correction system associated with one embodiment of the present invention as an imaging system aberration corrector.

The microscope 60 has an electron gun 61 that produces an electron beam (not shown) under control of a high voltage control portion 68 and accelerates the beam to a desired energy. The accelerated beam is then focused by a first condenser lens 62 and a second condenser lens 63. The focused beam is then passed through an objective lens and a specimen stage 64. Then, the beam is made to hit a specimen on the specimen stage.

The electron beam transmitted through the specimen passes through an imaging system aberration corrector 65. At this time, the aforementioned aberration correction is performed. The beam passed through the aberration corrector 65 is enlarged by an intermediate projector lens 66 and impinges on a fluorescent screen (not shown) in an observation chamber 67. The specimen image projected onto the fluorescent screen is captured by a camera.

When the electron beam passes through the imaging system aberration corrector 65, a positive spherical aberration produced by the objective lens is canceled out by a negative spherical aberration possessed by the aberration corrector 65. This aberration corrector removes 3-fold astigmatisms, 6-fold astigmatism, and other astigmatisms. Consequently, the spatial resolution of the transmission electron microscope is improved.

Aberration correction made by the imaging system aberration corrector 65 widens the range of incident angles of the electron beam in which aberration correction can be made. This, in turn, reduces diffraction aberration induced by an aperture (not shown). In consequence, the spatial resolution of the transmission electron microscope is improved further.

In the above examples, any one of the illumination system aberration corrector 53 and imaging system aberration corrector 65 is installed in a transmission electron microscope. A transmission electron microscope may also be equipped with both of these aberration correctors.

Having thus described my invention with the detail and particularity required by the Patent Laws, what is desired protected by Letters Patent is set forth in the following claims.

The invention claimed is:

1. An aberration correction system for use in an electron microscope, said aberration correction system comprising:
   three stages of multipole elements arranged in a row along an optical axis, each of the multipole elements having a thickness along the optical axis, the three stages of multipole elements including a front stage of multipole element, a middle stage of multipole element, and a rear stage of multipole element,
   wherein said front stage of multipole element produces a first magnetic or electric field of 3-fold symmetry with respect to the optical axis,
   wherein said middle stage of multipole element produces a second magnetic or electric field of 3-fold symmetry with respect to the optical axis,
   wherein said rear stage of multipole element produces a third magnetic or electric field of 3-fold symmetry with respect to the optical axis,
   wherein in the second magnetic or electric field, a distribution of a magnetic or electric field of 3-fold symmetry is created in a direction not to cancel out an astigmatism of 3-fold symmetry produced from the first magnetic or electric field or from the third magnetic or electric field,
   wherein in the third magnetic or electric field, a distribution of a magnetic or electric field of 3-fold symmetry is created in a direction not to cancel out an astigmatism of 3-fold symmetry produced from the first magnetic or electric field or from the second magnetic or electric field,
   wherein an aberration of 3-fold symmetry produced in the front stage of multipole element is rotated using the middle stage of multipole element,
   wherein an aberration of 3-fold symmetry produced from the middle stage of multipole element is rotated using the rear stage of multipole element, and
   wherein the astigmatisms of 3-fold symmetry are canceled out by combining the fields produced by the three stages of multipole elements, whereby spherical aberration and a higher-order aberration are corrected.

2. An aberration correction system for use in an electron microscope as set forth in claim 1,
   wherein any one of said second magnetic or electric field and said third magnetic or electric field is distributed to have been rotated through $120°\times m \pm 40°$ (where m is an integer) relative to said first magnetic or electric field within a plane perpendicular to the optical axis, taking account of a rotating action of an electron optical lens,
   wherein the other of the second magnetic or electric field and the third magnetic or electric field is distributed to have been rotated through $120°\times m \pm 80°$ relative to the first magnetic or electric field within the plane perpendicular to the optical axis, taking account of the rotating action of the electron optical lens, and
   wherein the second magnetic or electric field and the third magnetic or electric field are distributed to have been rotated in the same direction.

3. An aberration correction system for use in an electron microscope as set forth in claim 1, wherein said second magnetic or electric field is distributed to have been rotated through $120°\times m \pm$ about $72°$ (where m is an integer) relative to said first magnetic or electric field within the plane perpendicular to the optical axis, taking account of a rotating action of an electron optical lens, and wherein said third magnetic or electric field is distributed to have been rotated through $120°\times m \pm$ about $24°$ relative to the first magnetic or electric field within the plane perpendicular to the optical axis, taking account of the rotating action of the electron optical lens.

4. An aberration correction system for use in an electron microscope as set forth in any one of claims 1 to 3, further comprising:
   a pair of first transfer lenses mounted between said front stage of multipole element and said middle stage of multiple element and having two stages of axisymmetric lenses; and
   a pair of second transfer lenses mounted between the middle stage of multipole element and said rear stage of multipole element and having two stages of axisymmetric lenses.

5. An aberration correction system for use in an electron microscope as set forth in claim 4, further comprising a pair of third transfer lenses mounted ahead of or behind said three stages of multipole elements arranged in a row along an optical axis.

6. An aberration correction system for use in an electron microscope as set forth in any one of claims 1 to 3, wherein each of said three stages of multipole elements has a magnetic polepiece capable of being excited independently or an electrode capable of being applied with a voltage independently.

7. An aberration correction system for use in an electron microscope as set forth in any one of claims 1 to 3, wherein each of said three stages of multipole elements has a hexapole element.

8. An aberration correction system for use in an electron microscope as set forth in any one of claims 1 to 3, wherein each of said three stages of multipole elements has a dodecapole element.

9. An aberration correction system for use in an electron microscope as set forth in any one of claims 1 to 3, further comprising means for rotating the three stages of multipole elements within the plane perpendicular to the optical axis.

10. An aberration correction system for use in an electron microscope as set forth in any one of claims 1 to 3, wherein said three stages of multipole elements are uniform in thickness.

* * * * *